United States Patent
Ewanchuk et al.

(10) Patent No.: US 11,448,557 B2
(45) Date of Patent: Sep. 20, 2022

(54) METHOD AND DEVICE FOR DETERMINING JUNCTION TEMPERATURE OF DIE OF SEMICONDUCTOR POWER MODULE

(71) Applicant: MITSUBISHI ELECTRIC CORPORATION, Tokyo (JP)

(72) Inventors: Jeffrey Ewanchuk, Rennes (FR); Stefan Mollov, Rennes (FR); Jonathan Robinson, Rennes (FR); Julio Brandelero, Rennes (FR)

(73) Assignee: Mitsubishi Electric Corporation, Tokyo (JP)

( * ) Notice: Subject to any disclaimer, the term of this patent is extended or adjusted under 35 U.S.C. 154(b) by 1023 days.

(21) Appl. No.: 16/064,379

(22) PCT Filed: Jan. 30, 2017

(86) PCT No.: PCT/JP2017/004136
§ 371 (c)(1),
(2) Date: Jun. 20, 2018

(87) PCT Pub. No.: WO2017/141743
PCT Pub. Date: Aug. 24, 2017

(65) Prior Publication Data
US 2018/0372553 A1    Dec. 27, 2018

(30) Foreign Application Priority Data
Feb. 18, 2016  (EP) ..................................... 16156238

(51) Int. Cl.
*G01K 7/16*    (2006.01)
*H03K 17/12*   (2006.01)
(Continued)

(52) U.S. Cl.
CPC ............... *G01K 7/16* (2013.01); *G01K 7/015* (2013.01); *G01K 13/00* (2013.01); *H03K 17/122* (2013.01);
(Continued)

(58) Field of Classification Search
CPC ...... H01L 23/34; G01K 2217/00; G01K 7/01; G01K 7/16
(Continued)

(56) References Cited

U.S. PATENT DOCUMENTS 6,060,792 A  *  5/2000  Pelly .................. H03K 17/0828
                                                        307/117
8,923,022 B2 * 12/2014  Zoels .................. H01L 27/0248
                                                        363/34
(Continued)

FOREIGN PATENT DOCUMENTS

DE  10 2010 000 875 A1  7/2011
JP        09-252066 A    9/1997
(Continued)

OTHER PUBLICATIONS

N. Baker, S. Munk-Nielsen, F. Iannuzzo and M. Liserre, "Online junction temperature measurement using peak gate current," 2015 IEEE Applied Power Electronics Conference and Exposition (APEC), 2015, pp. 1270-1275, doi: 10.1109/APEC.2015.7104511. (Year: 2015).*

(Continued)

*Primary Examiner* — Lisa M Caputo
*Assistant Examiner* — Janice M Soto
(74) *Attorney, Agent, or Firm* — Birch, Stewart, Kolasch & Birch, LLP

(57) ABSTRACT

A method for determining the junction temperature of at least one die of a semiconductor power module, the semiconductor power module being composed of plural dies (Continued)

connected in parallel and switching between conducting and non conductor states according to pattern cycles, the method comprises the steps of: disabling the conducting of the at least one die during at least a fraction of one switching cycle, applying a current limited voltage to the gate of the at least one die during a period of time of the cycle wherein the at least one die is not conducting, the resulting voltage excursion having a value that does not enable the die to be conducting, measuring the voltage at the gate of the die, deriving from the measured voltage a temperature variation of the junction of the at least one die or the temperature of the junction of the die.

19 Claims, 5 Drawing Sheets

(51) Int. Cl.
    *H03K 17/14*     (2006.01)
    *G01K 7/01*     (2006.01)
    *G01K 13/00*     (2021.01)

(52) U.S. Cl.
    CPC ....... *H03K 17/145* (2013.01); *G01K 2217/00* (2013.01)

(58) Field of Classification Search
    USPC ........ 374/E7.035, 152; 257/E23.08; 327/513
    See application file for complete search history.

(56) References Cited

U.S. PATENT DOCUMENTS

| | | | |
|---|---|---|---|
| 2007/0004054 A1* | 1/2007 | Orr | H01L 23/34 438/10 |
| 2008/0301511 A1* | 12/2008 | Miller | G01R 31/31928 714/733 |
| 2013/0328596 A1* | 12/2013 | Zoels | H03K 17/18 327/109 |
| 2014/0054762 A1 | 2/2014 | Nagaune | |
| 2014/0138063 A1 | 5/2014 | Kawaura et al. | |
| 2015/0377717 A1 | 12/2015 | Rollin et al. | |

FOREIGN PATENT DOCUMENTS

| | | |
|---|---|---|
| JP | 2004-103734 A | 4/2004 |
| JP | 2012-227367 A | 11/2012 |
| JP | 2013-138193 A | 7/2013 |
| WO | WO 2012/157247 A1 | 11/2012 |

OTHER PUBLICATIONS

Notification of Reasons for Refusal issued in corresponding Japanese Application No. 2018-516245 dated Mar. 12, 2019.

* cited by examiner

METHOD AND DEVICE FOR DETERMINING JUNCTION TEMPERATURE OF DIE OF SEMICONDUCTOR POWER MODULE

TECHNICAL FIELD

The present invention relates generally to a method and device for determining the junction temperature of at least one die of a semiconductor power module.

BACKGROUND ART

The junction temperature of internal semiconductor devices is a useful parameter for the determination of the state of health of the power semiconductor module. However, as the junction temperature does not correspond to an actual point on the surface of the die, the measured temperature represents a theoretical average rather than the effective junction temperature. Hence, this temperature cannot be directly measured via traditional methods of temperature sensing. Furthermore, the encapsulation of the power semiconductor module makes some direct measurement, like optical techniques, impossible.

A secondary issue with the measurement of the junction temperature for a power die stems from the fact that this temperature must be inferred from a thermally sensitive parameter, rather than directly measured.

Thus, in industrial module, the junction temperature is not measured in operation due to the difficulties in acquiring this data.

SUMMARY OF INVENTION

The present invention aims at determining the junction temperature of at least one die of a semiconductor power module without any intrusive means in a reliable fashion.

To that end, the present invention concerns a method for determining the junction temperature of at least one die of a semiconductor power module, the semiconductor power module being composed of plural dies connected in parallel and switching between conducting and non conducting states according to pattern cycles, characterized in that the method comprising:

setting the at least one die in a non-conducting state during at least a fraction of one switching cycle,
applying a current limited voltage to the gate of the at least one die during a period of time of the cycle wherein the at least one die is not conducting, the applied current limited voltage having a voltage value that does not enable the die to be conducting,
measuring the voltage at the gate of the die,
deriving from the measured voltage a temperature variation of the junction of the at least one die or the temperature of the junction of the die.

The present invention concerns also a device for determining the junction temperature of at least one die of a semiconductor power module, the semiconductor power module being composed of plural dies connected in parallel and switching between conducting and non conducting states according to pattern cycles, characterized in that the device comprises: processing circuitry to set the at least one die in a non-conducting state during at least a fraction of one switching cycle,
to apply a current limited voltage to the gate of the at least one die during a period of time of the cycle wherein the at least one die is not conducting, the applied current limited voltage having a voltage value that does not enable the die to be conducting,
to measure the voltage at the gate of the die,
to derive from the measured voltage a temperature variation of the junction of the at least one die or the temperature of the junction of the die.

Thus, the junction temperature of the die or dies can be used to indicate the state of health of the power module and the current state of loading.

According to a particular feature, the gates of all the dies are connected together and all the dies are disabled during the same cycle, the current limited voltage is applied to the gates of all the dies during the period of time of the cycle wherein the dies are not conducting and the temperature variation or the temperature is the average temperature or temperature variation of the junctions of the dies.

Thus, the average temperature measurement of the entire power module can occur in normal operation of the semiconductor power module, where non-conducting states exist in a periodic manner.

According to a particular feature, the gate of each die is not connected to the gates of the other dies and a single die is disabled during one cycle.

Thus, a single die temperature can be measured during normal operation of the power module reflecting individual state of health of each die.

According to a particular feature, the dies are disabled at different cycles based on a round robin basis.

Thus, each die can be measured separately in the semiconductor power module to detect individual die temperature anomalies with only a single analogue to digital converter.

According to a particular feature, the current limited voltage to the gate of the die is applied after the commutation to the conducting state of the other dies is complete.

Thus, the sampling time for the measured gate voltage is lessened and the cost of the acquisition hardware is kept low.

According to a particular feature, the voltage at the gate of the die is measured at a time that takes into account characteristic of an analogue to digital converter used for digitizing measured voltage.

Thus, a single analogue to digital converter can be used as a means to detect each die temperature without the need for additional analog to digital converters.

According to a particular feature, the method comprises further step of interrupting the current limited voltage provided to the gate after the measurement.

Thus, the time to measure the junction temperature of the die can be reduced to only the necessary time to obtain a sample.

According to a particular feature, the current of the applied voltage is comprised between 10 to 100 mA.

Thus, a practical analogue to digital converter can be used, keeping the hardware cost low.

The characteristics of the invention will emerge more clearly from a reading of the following description of example embodiments, the said description being produced with reference to the accompanying drawings.

DESCRIPTION OF EMBODIMENTS

Figure 1A:
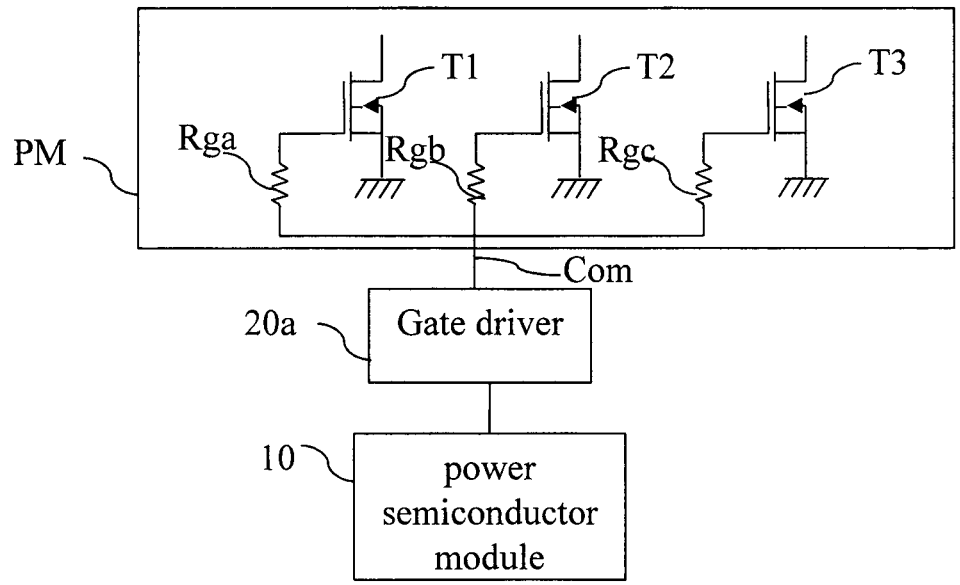
FIG. 1a represents a first example of realization of an architecture of a system for determining the junction temperature of a die of a semiconductor power module according to the present invention.

FIG. 1a represents a first example of realization of an architecture of a system for determining the junction temperature of a die of a semiconductor power module according to the present invention.

The system comprises a device for determining the junction temperature of a die of a power semiconductor module 10, a gate driver 20a and a semiconductor power module PM.

In the first example of realization of the present invention, the determination of the junction temperature is performed in real time operation using a single gate driver 20a which provides a common gate signal Com to each die T1, T2 and T3 of the semiconductor power module PM. The dies T1, T2 and T3 are connected in parallel.

According to the present invention, the equivalent resistance of the internal gate resistances in parallel of the dies T1 to T3 measurement is performed in a period of time wherein the semiconductor power module PM is in inactive state. For example, the measurement of the resistance of the internal gate resistances in parallel of the dies T1 to T3 is performed periodically, for example every 10 or 20 cycles of consecutive ON and OFF switching states.

According to the invention, an extra gate voltage supply with current limiting features is provided for the measurement of the equivalent gate resistance. As the internal gate resistance is dependant on the temperature, the equivalent gate resistance enables the determination of an average value of the junction temperatures of the dies T1 to T3.

The extra gate voltage is an extra mid-level voltage stage in the negative gate causing the gate voltage to increase to an intermediate level below the threshold switching voltage.

As the mid-level voltage stage is only used for measurement, the extra gate voltage supply can be designed with a current limit to lengthen the charging time of the gate voltage, and thereby decrease the demands on the acquisition hardware.

In the example of FIG. 1a, the semiconductor power module PM is composed of three dies T1 to T3 connected in parallel and each gate of the dies T1 to T3 is connected in series with a resistance Rga, Rgb and Rgc. The present invention is also applicable for a semiconductor power module PM comprising a single die or a more important number of dies.

Figure 1B:
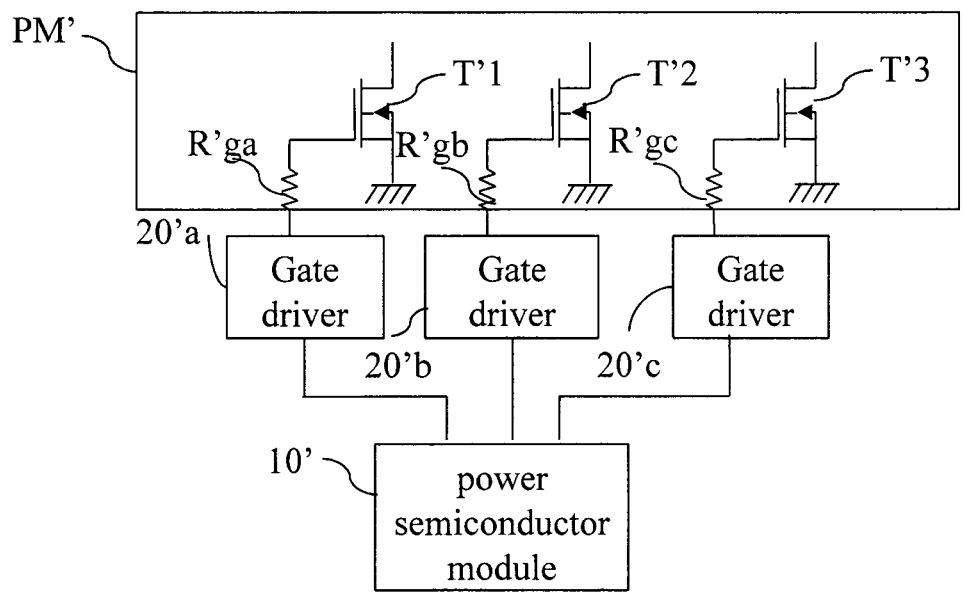
FIG. 1b represents a second example of realization of an architecture of a system for determining the junction temperature of a die of a semiconductor power module according to the present invention.

FIG. 1b represents a second example of realization of an architecture of a system for determining the junction temperature of a die of a semiconductor power module according to the present invention.

The system comprises a device for determining the junction temperature of a die of a power semiconductor module 10', one gate driver 20'a, 20'b and 20'c for each die and a semiconductor power module PM'.

In the example of FIG. 1b, the semiconductor power module PM' is composed of three dies T'1 to T'3. Each gate of the dies T'1 to T'3 is connected in series with a resistance R'ga, R'gb and R'gc. The present invention is also applicable for a semiconductor power module PM' comprising a single die or a more important number of dies.

According to the second mode of realization of the present invention, the measurement of the junction temperature is performed in real time operation by the use of individually controlled gates within semiconductor power module. The dies may be held inactive for a single switching cycle without adversely affecting the output performance of the semiconductor power module PM.

As individual control of each parallel connected device is possible, real time junction temperature determination is enabled for the entire array of parallel power dies, the estimation of the junction temperature is specific to each die T1 to T3 enabling a relative distribution of temperatures within the semiconductor power module. The sensitivity to individual dies aging is increased as the gate resistance is measured for a single die rather than a series of parallel connected devices.

According to the present invention each internal gate resistance determination is performed in a period of time wherein the die is in inactive state for example on a round robin bases.

According to the invention, an extra gate voltage supply with current limiting features is provided for the measurement of each internal gate resistance. As the internal gate resistance is dependant on the temperature, the equivalent gate resistance enables the determination an average value of the junction temperature of each dies T1 to T3.

The extra gate voltage is an extra mid-level voltage stage in the negative causing the gate voltage to increase to an intermediate level below the threshold switching voltage.

As the mid-level voltage is only used for measurement, the extra gate voltage supply can be designed with a current limit to lengthen the charging time of the gate voltage, and thereby decrease the demands on the acquisition hardware.

Figure 2:
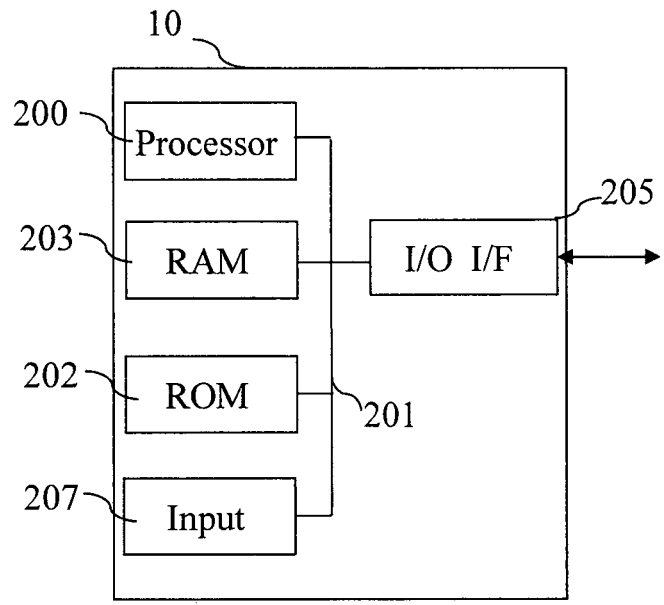
FIG. 2 represents an example of the architecture of a device for determining the junction temperature of a die of a power semiconductor module according to the present invention.

FIG. 2 represents an example of the architecture of a device for determining the junction temperature of a die of a power semiconductor module according to the present invention.

Figure 6:
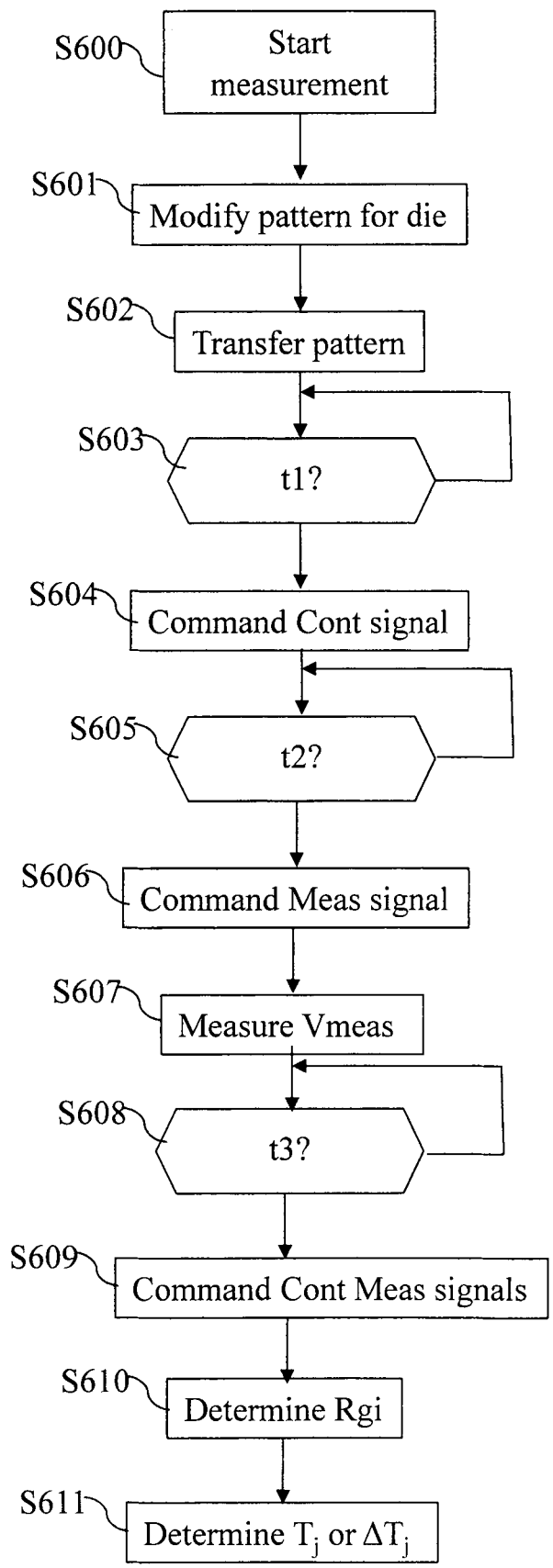
FIG. 6 is an example of an algorithm executed by the device for determining the junction temperature of a die of a power semiconductor module according to the present invention.

The device for determining the junction temperature of a die 10 has, for example, an architecture based on components connected together by a bus 201 and a processor 200 controlled by a program as disclosed in FIG. 6.

The bus 201 links the processor 200 to a read only memory ROM 202, a random access memory RAM 203 and an input output I/O IF interface 405.

The memory 203 contains registers intended to receive variables and the instructions of the program related to the algorithm as disclosed in FIG. 6.

The processor 200 receives through the input output I/O IF 205, switching patterns to be applied for the dies T1 to T3, sensed voltages to be used for determining the temperature of the dies T1 to T3 and transfers modified switching patterns, control signal Meas enabling a measurement of the internal gate resistance of the dies T1 to T3 and a control signal Cont which enables the providing of the mid-level voltage.

The read-only memory, or possibly a Flash memory 202 contains instructions of the program related to the algorithm as disclosed in FIG. 6, when the device for determining the junction temperature of a die 10 is powered on, to the random access memory 203.

The device for determining the junction temperature of a die 10 may be implemented in software by execution of a set of instructions or program by a programmable computing machine, such as a PC (Personal Computer), a DSP (Digital Signal Processor) or a microcontroller; or else implemented in hardware by a machine or a dedicated component, such as an FPGA (Field-Programmable Gate Array) or an ASIC (Application-Specific Integrated Circuit).

Figure 7:
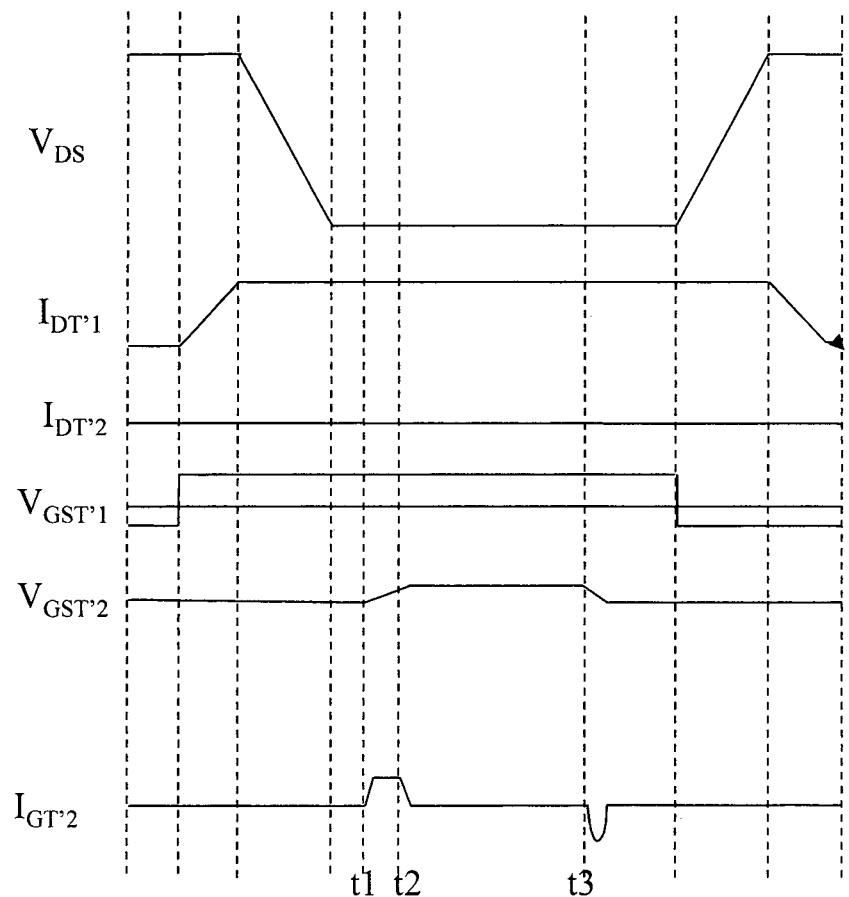
FIG. 7 represents chronograms of the signals used for determining the junction temperature of a die of a power semiconductor module according to the present invention.

In other words, the device for determining the junction temperature of a die 10 includes circuitry, or a device including circuitry, causing the device for determining the junction temperature of a die 10 to perform the program related to the algorithm as disclosed in FIG. 7.

Figure 3B:
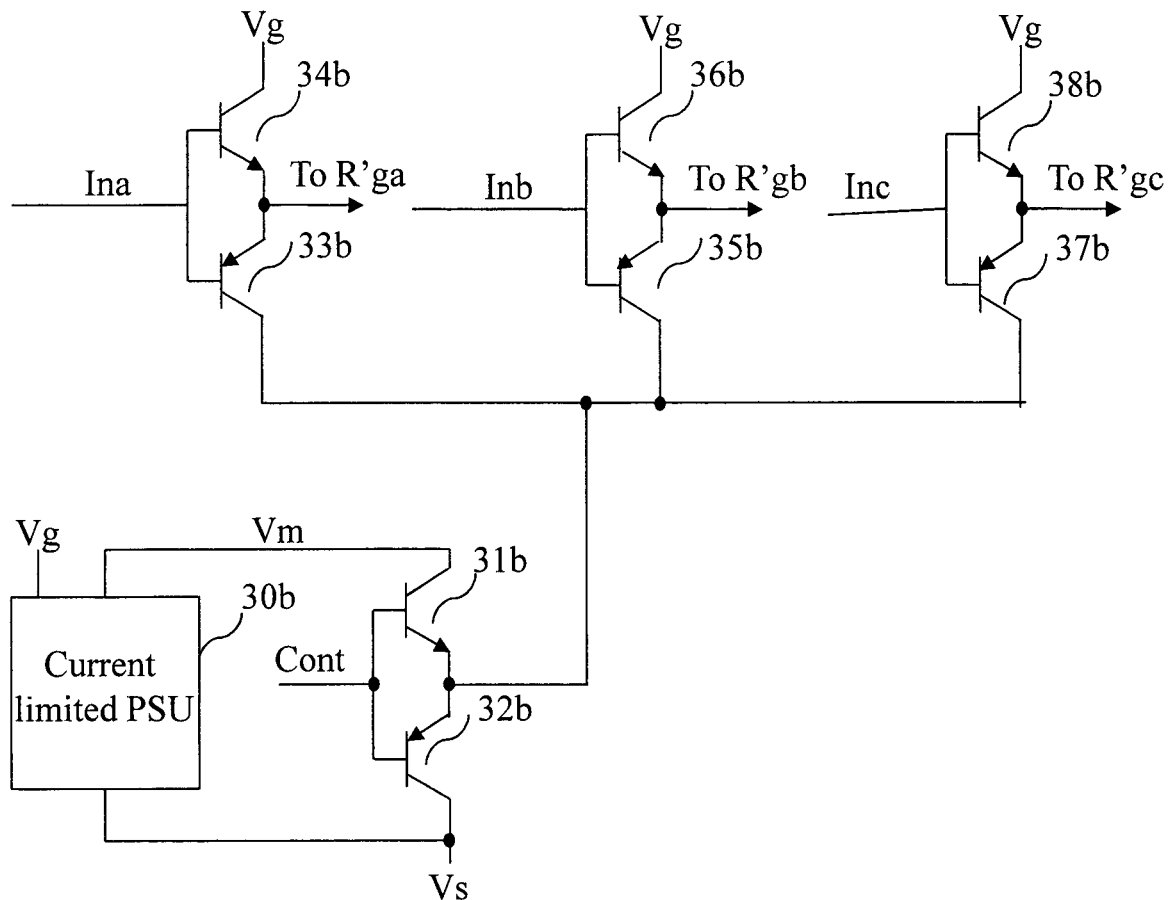
FIG. 3b represents an example of an electric circuit of a gate driver used in the second example of realization of the present invention.
Figure 3A:
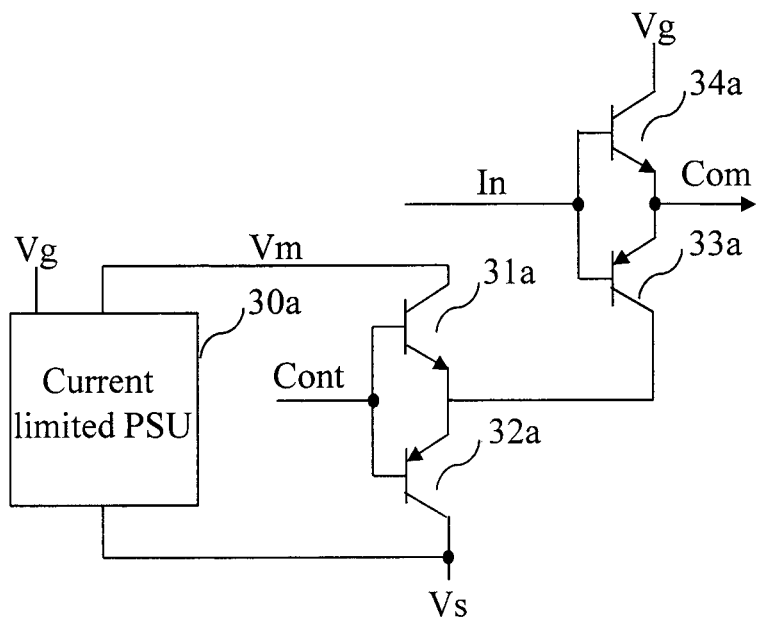
FIG. 3a represents an example of a an electric circuit of a gate driver used in the fisrt example of realization of the present invention.

FIG. 3a represents an example of an electric circuit of a gate driver used in the first example of realization of the present invention.

The gate driver 20 is power supplied by a power voltage Vg and a negative voltage Vs.

The gate driver 20 comprises a current limited power supply 30a which provides an extra mid-level voltage Vm in the negative causing the gate voltage to increase to an intermediate level below the threshold switching voltage.

The current limited power supply unit is connected to the positive voltage Vg and to the negative voltage Vs.

A control signal Cont enabling the providing of the mid-level voltage Vm is fed to the bases of transistors 31a and 32a.

The corector of the transistor 32a is connected to the negative voltage supply Vs and the emitter of the transistor 32a is connected to the emitter of the transistor 31a and to the corector of a transistor 33a.

The collector of the transistor 31a is connected to the mid-level voltage Vm.

The emitter of the transistor 33a is connected to the emitter of the transistor 34a and outputs the signal Com used as a gate signal for the dies T1 to T3.

The signal In is the switching pattern to be applied for the dies T1 to T3.

The collector of the transistor 34a is connected to the positive power supply Vg.

FIG. 3b represents an example of a an electric circuit of a gate driver used in the second example of realization of the present invention.

The gate driver 20b is power supplied by a power voltage Vg and a negative voltage Vs.

The gate driver 20b comprises a current limited power supply 30b which provides an extra mid-level voltage Vm in the negative causing the gate voltage to increase to an intermediate level below the threshold switching voltage.

The current limited power supply unit is connected to the positive voltage Vg and to the negative voltage Vs.

A control signal Cont enabling the providing of the mid-level voltage Vm isfed to the bases of transistors 31b and 32b.

The corector of the transistor 32b is connected to the negative voltage supply Vs and the emitter of the transistor 32b is connected to the emitter of the transistor 31b and to the corectors of the transistors 33b, 35b and 37b.

The collector of the transistor 31b is connected to the mid-level voltage Vm.

The emitter of the transistor 33b is connected to the emitter of the transistor 34b and outputs the signal used as a gate signal for the die T'1.

The signal Ina is the switching patterns to be applied to the die T'1 and is fed to the bases of transistors 33b and 34b.

The collector of the transistor 34b is connected to the positive power supply Vg.

The emitter of the transistor 35b is connected to the emitter of the transistor 36b and outputs the signal used as a gate signal for the die T'2.

The signal Inb is the switching patterns to be applied to the die T'2 and is fed to the bases of transistors 35b and 36b.

The collector of the transistor 36b is connected to the positive power supply Vg.

The emitter of the transistor 37b is connected to the emitter of the transistor 38b and outputs the signal used as a gate signal for the die T'3.

The signal Inc is the switching patterns to be applied to the die T'3 and is fed to the bases of transistors 37b and 38b.

The collector of the transistor 38b is connected to the positive power supply Vg.

Figure 4:
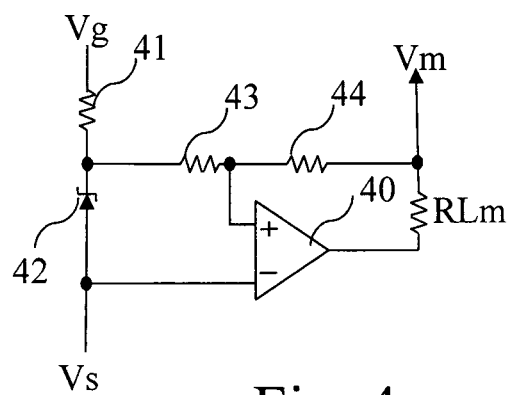
FIG. 4 represents an example of an electric power source with a current limitation used in the first and second examples of the present invention.

FIG. 4 represents an example of an electric power source with a current limitation used in the first and second examples of realization of the present invention.

The electric power source with a current limitation is for example composed of an operational amplifier 40, a zener diode 42 and three resistances noted 41, 43, 44.

The resistor RLm represents the equivalent load seen by the electric power source with a current limitation, which is the equivalent resistance from the Vm to Vs terminals.

The anode of the Zener diode 42 is connected to the negative power supply Vs and to the negative input of the operational amplifier 40. The cathode of the Zener diode 42 is connected to a first terminal of the resistor 41 and to a first terminal of the resistor 43. A second terminal of the resistor 41 is connected to the positive power supply Vg. A second terminal of the resistor 43 is connected to a first terminal of the resistor 44 and to the positive input of the operational amplifier 40.

The load RLm is between the output of the operational amplifier 40 and the second terminal of the resistor 44.

Figure 5:
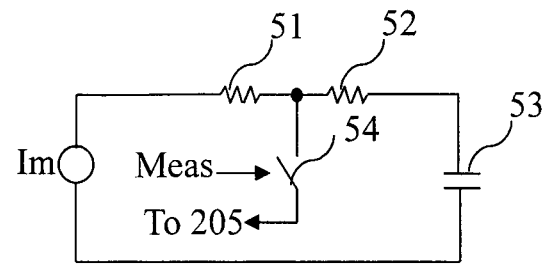
FIG. 5 is an example of the electric model used for determining the junction temperature of a die of a power semiconductor module according to the present invention.

FIG. 5 is an example of the electric model used for determining the junction temperature of a die of a power semiconductor module according to the present invention.

The electric model comprises a current source Im, two resistors 51 and 52, a capacitor 53 and a switch 54 that is conducting when a measurement of a voltage Vmeas is performed in order to determined the junction temperature of the die.

The capacitor 53 is the internal capacitance gate to source of the die, the resistor 52 is the internal resistance of the gate that is dependent of the temperature, the resistor 51 is the resistor Rga or Rgb or Rgc or R'ga or R'gb or R'gc shown in FIG. 1 and the current source Im represents the limited current provided by the electric power source with a current limitation shown in FIG. 4.

As the capacitance of the capacitor 53 does not vary in time, by measuring the voltage between the resistors 51 and 52, it is possible to determine the internal resistance value 52 and then determine the junction temperature T.

A first terminal of the current source Im is connected to a first terminal of the resistor 51. A second terminal of the resistor 51 is connected to a first terminal of the resistor 52 and to a first terminal of the switch 54. A second terminal of the switch 54 is connected to an input of an analogue to digital converter of the the I/O interface 205. A second terminal of the resistor 52 is connected to a first terminal of the capacitor 53, the second terminal of which is connected to a second terminal of the current source Im.

FIG. 6 is an example of an algoritm executed by the device for determining the junction temperature of a die of a power semiconductor module according to the present invention.

The present algorithm will be disclosed in an example wherein it is executed by the processor 200.

At step S600, the processor 200 starts a junction temperature determination of one or plural dies. According to the example of FIG. 1a, the average temperature of the dies of the power seminconductor module is determined or, according to the example of FIG. 1b, the junction temperature of one die of the power semiconductor module is determined.

For example, a single die is held inactive for a single switching cycle. This inactive state is periodically rotated between dies through the operation of the power semi conductor module, and thereby providing estimation for each die once the rotation is complete.

At next step S601, the processor 200 modifies the pattern to be applied for the die by disabling the conduction of the die during one period.

At next step S602, the processor 200 transfers the modified pattern in combination with not modified patterns for the other dies of the power semiconductor module according to the example of FIG. 1b.

An example is given in FIG. 7.

FIG. 7 represents chronograms of the signals used for determining the junction temperature of a die of a power semiconductor module according to the present invention.

FIG. 7 shows an example of the behaviour of two dies, like the dies T'1 and T'2. The junction temperature of the die T'2 is determined whereas the die T'1 is in not disabled state.

The voltage $V_{DS}$ is the voltage between the drain and the source of the die T' 1.

The drain current $I_{DT'1}$ of the die T'1 varies as the die T'1 is not disabled and the drain current $I_{DT'2}$ of the die T'2 is null as the die T'2 is disabled.

At next step S603, the processor 200 checks if the time t1 is reached.

At time t1, a steady state point of operation exists after the current and voltage commutation in the neighboring die T'1 is complete. The time t1 is determined to be longer than the longest commutation duration (i.e. 0.5 us for a 1.2 kV SiC MOSFET).

If the time t1 is reached, the processor 200 moves to step S604. Otherwise, the processor 200 returns to step S603.

At step S604, the processor 200 commands the I/O interface 205 to activate the signal Cont which enables the providing of the voltage Vm.

After time t1, the mid-level voltage supply is enabled, causing the gate circuit to charge at a level of Im. The current $I_{GT2}$ shown in FIG. 7 reaches after t1, the level Im. Note that the mid-level voltage is selected such that Vm+Vs is lower than the threshold voltage of the die T'2. At next step S605, the processor 200 checks if the time t2 is reached.

The time t2 is for example determined as the longest time-constant for stable measurement for the analogue to digital converter comprised in the I/O interface 205 and used for digitizing measured analogue signal.

If the time t2 is reached, the processor 200 moves to step S606. Otherwise, the processor 200 returns to step S605.

By utilizing the current limited supply voltage, the sensitivity of the gate resistance measurement with respect to the measured voltage allows the resistance to be a product of the measurement current, and two parameters, time t2 and the Ciss, which does not vary with voltage due to the device being in steady state conditions.

At step S606, the processor 200 commands the I/O interface 205 to activate the signal Meas which makes the switch 54 conducting.

At next step S607, the voltage between the resistors 51 and 52 is measured.

At next step S608, the processor 200 checks if the time t3 is reached.

The time t3 must be large enough to not interrupt the sampling time of the gate voltage.

If the time t3 is reached, the processor 200 moves to step S609. Otherwise, the processor 200 returns to step S608.

At step 609, the processor 200 commands the I/O interface 205 to deactivate the signal Cont which enables the providing of the voltage Vm and to deactivate the signal Meas which makes the swtich 54 conducting.

Afterwards, the semiconductor power module is then ready for normal operation. After the sample time, t3, the gate is then discharged back to its original state.

At next step S610, the processor 200 determines the gate internal resistance $Rg_i$:

$$Vmeas(t) = I_m \cdot Rg_i + \frac{1}{C_{iss}} \int_0^{t2} I_m dt$$

$$Rg_i = \frac{1}{I_m} \cdot \left[ Vmeas - \frac{t2}{C_{iss}} \right]$$

At next step S611, the processor 200 determines the junction temperature in Kelvin as:

$$Tj \sim k(Rg_i - Rg@20K) + 25K$$

k is dependent of the die. For example, k=285K/Ω,

Note that due to the small magnitude of the capacitor 53 noted Ciss, the current might be on the order of 10-100 mA. Furthermore, the measurement time t2 must be triggered after time t1, where this time difference can be matched to the necessary time needed for sampling for the analogue to digital converter. However, the measured voltage must remain below the mid-state voltage, and hence, this time is a product of the Ciss, measurement delay time, and the gate resistance values. The time t3 can be selected after t2 without any consequence on the measurement operation but must be less than the time at which the next commutation occurs.

Considering operation in a semiconductor power module comprising plural dies, where individual die level information is available, the relative temperature difference can instead be measured rather than the absolute temperature thus removing the dependency of the measured voltage on the Ciss value. In this method, the gate resistance (and hence the junction temperature) is related to the difference in the calibrated sample voltages from die to die. Considering that Ciss is constant for each time, and the time t2 is a user defined parameter, the voltage difference between each measurement channel is representative of the relative temperature $$\Delta Tj \sim k\Delta Rg_i = \frac{1}{I_m} \cdot \Delta Vmeas$$

Naturally, many modifications can be made to the embodiments of the invention described above without departing from the scope of the present invention.

INDUSTRIAL APPLICABILITY

The method and device of this invention are applicable to determinations of the junction temperature of dies of the semiconductor power modules in many kinds of fields.

The invention claimed is:

1. Method for determining the junction temperature of at least one die of a semiconductor power module, the semiconductor power module being composed of plural dies connected in parallel and switching between conducting and non conducting states according to pattern cycles, the method comprising:
setting the at least one die in a non-conducting state during at least a fraction of one switching cycle,
applying a current limited voltage to the gate of the at least one die during a period of time of the cycle wherein the at least one die is not conducting, the resulting voltage excursion having a value that does not enable the at least one die to be conducting,
measuring the voltage at the gate of the at least one die,
calculating a gate internal resistance based on the measured voltage, and
deriving from the gate internal resistance a temperature variation of the junction of the at least one die or the temperature of the junction of the at least one die,
wherein a sampling time for each voltage measurement used for calculating the gate internal resistance is limited to a time during which the at least one die is not enabled to be conducting.

2. Method according to claim 1, wherein the gates of all the dies are connected together and all the dies are disabled during the same cycle, the current limited voltage is applied to the gates of all the dies during the period of time of the cycle wherein the dies are not conducting and the temperature variation or the temperature is the average temperature or average temperature variation of the junctions of the dies.

3. Method according to claim 2, wherein the current of the applied voltage is comprised between 10 to 100 mA.

4. Method according to claim 1, wherein the current of the applied voltage is comprised between 10 to 100 mA.

5. Method for determining the junction temperature of at least one die of a semiconductor power module, the semiconductor power module being composed of plural dies connected in parallel and switching between conducting and non conducting states according to pattern cycles, the method comprising:
setting the at least one die in a non-conducting state during at least a fraction of one switching cycle,
applying a current limited voltage to the gate of the at least one die during a period of time of the cycle wherein the at least one die is not conducting, the resulting voltage excursion having a value that does not enable the at least one die to be conducting,
measuring the voltage at the gate of the at least one die,
calculating a gate internal resistance based on the measured voltage, and
deriving from the gate internal resistance a temperature variation of the junction of the at least one die or the temperature of the junction of the at least one die,
wherein the gate of each die is not connected through one node to the gates of the other dies and a single die is disabled during one cycle.

6. Method according to claim 5, wherein the dies are disabled at different cycles based on a round robin basis.

7. Method according to claim 6, wherein the current of the applied voltage is comprised between 10 to 100 mA.

8. Method according to claim 5, wherein the current limited voltage to the gate of the die is applied after the commutation to the conducting state of the other dies is complete.

9. Method according to claim 8, wherein the voltage at the gate of the die is measured at a time based on a characteristic of an analogue to digital converter used for digitizing measured voltage, the characteristic being determinative of a longest time-constant for stable measurement by the analogue to digital converter.

10. Method according to claim 9, wherein the current of the applied voltage is comprised between 10 to 100 mA.

11. Method according to claim 8, wherein the method comprises further interrupting the current limited voltage provided to the gate after the measurement.

12. Method according to claim 11, wherein the current of the applied voltage is comprised between 10 to 100 mA.

13. Method according to claim 8, wherein the current of the applied voltage is comprised between 10 to 100 mA.

14. Method according to claim 5, wherein the voltage at the gate of the die is measured at a time based on a characteristic of an analogue to digital converter used for digitizing measured voltage, the characteristic being determinative of a longest time-constant for stable measurement by the analogue to digital converter.

15. Method according to claim 14, wherein the current of the applied voltage is comprised between 10 to 100 mA.

16. Method according to claim 5, wherein the method comprises further interrupting the current limited voltage provided to the gate after the measurement.

17. Method according to claim 16, wherein the current of the applied voltage is comprised between 10 to 100 mA.

18. Method according to claim 5, wherein the current of the applied voltage is comprised between 10 to 100 mA.

19. Device for determining the junction temperature of at least one die of a semiconductor power module, the semiconductor power module being composed of plural dies connected in parallel and switching between conducting and non conducting states according to pattern cycles, the device comprises: processing circuitry
to set the at least one die in a non-conducting state during at least a fraction of one switching cycle,
to apply a current limited voltage to the gate of the at least one die during a period of time of the cycle wherein the at least one die is not conducting, the applied current limited voltage having a voltage value that does not enable the at least one die to be conducting,
to measure the voltage at the gate of the at least one die,
to calculate a gate internal resistance based on the measured voltage,
to derive from the gate internal resistance a temperature variation of the junction of the at least one die or the temperature of the junction of the at least one die,
wherein a sampling time for each voltage measurement used for calculating the gate internal resistance is limited to a time during which the at least one die is not enabled to be conducting.

* * * * *